United States Patent
Kocaman et al.

(10) Patent No.: US 8,369,453 B2
(45) Date of Patent: Feb. 5, 2013

(54) ADAPTIVE OFFSET ADJUSTMENT ALGORITHM

(75) Inventors: Namik Kemal Kocaman, San Clemente, CA (US); Afshin Momtaz, Laguna Hills, CA (US); Velu Chellam Pillai, Austin, TX (US); Vivek Telang, Austin, TX (US); Sundararajan Chidambara, Austin, TX (US); Magesh Valliappan, Austin, TX (US)

(73) Assignee: Broadcom Corporation, Irvine, CA (US)

( * ) Notice: Subject to any disclaimer, the term of this patent is extended or adjusted under 35 U.S.C. 154(b) by 1080 days.

(21) Appl. No.: 12/314,051

(22) Filed: Dec. 3, 2008

(65) Prior Publication Data

US 2010/0135442 A1 Jun. 3, 2010

(51) Int. Cl.
*H03K 9/00* (2006.01)

(52) U.S. Cl. ........ 375/316; 375/219; 375/295; 375/297; 375/345; 330/278; 330/295; 455/234; 455/253

(58) Field of Classification Search .................. 375/316, 375/219, 295, 297, 345; 330/278, 295; 455/234, 455/253
See application file for complete search history.

(56) References Cited

U.S. PATENT DOCUMENTS

2008/0170646 A1\* 7/2008 Sobchak et al. .............. 375/345

\* cited by examiner

*Primary Examiner* — Zewdu Kassa
(74) *Attorney, Agent, or Firm* — Sterne, Kessler, Goldstein & Fox P.L.L.C.

(57) ABSTRACT

An apparatus and method is disclosed to compensate for one or more offsets in a communications signal. A communications receiver may carry out an offset adjustment algorithm to compensate for the one or more offsets. An initial search procedure determines one or more signal metric maps for one or more selected offset adjustment corrections from the one or more offset adjustment corrections. The offset adjustment algorithm determines one or more optimal points for one or more selected offset adjustment correction based upon the one or more signal maps. The adaptive offset algorithm adjusts each of the one or more selected offset adjustment corrections to their respective optimal points and/or each of one or more non-selected offset adjustment corrections to a corresponding one of a plurality of possible offset corrections to provide one or more adjusted offset adjustment corrections. A tracking mode procedure optimizes the one or more adjusted offset adjustment corrections.

23 Claims, 8 Drawing Sheets

ADAPTIVE OFFSET ADJUSTMENT ALGORITHM

FIELD OF THE INVENTION

The present invention relates generally to a communication receiver and specifically to using an adaptive offset adjustment algorithm to compensate for one or more offsets in the presence of one or more asymmetries.

BACKGROUND

A conventional communication system typically involves transmitting a communications signal representing one or more information signals from a conventional communications transmitter to a conventional communications receiver over a communication channel. A noise figure (NF) is a measure of degradation of a signal to noise ratio (SNR) of the communications signal, caused by components of the conventional communications receiver. Commonly, the conventional communications receiver includes a series of amplifiers to optimize a total NF of the conventional communications receiver.

The communication channel contains a propagation medium that the communications signal passes through before reception by the conventional communications receiver. The propagation medium of the communications channel may introduce interference and/or distortion into the communications signal causing the communications signal as received by the conventional communications receiver to differ from the communications signal as transmitted by the conventional communications transmitter. For example, the propagation medium of the communications channel may cause one or more asymmetries in the communications signal. The one or more asymmetries may cause one or more offsets in the communications signal.

To correct for the one or more asymmetries in the communications signal, the conventional communications receiver adjusts the communications signal by a single offset adjustment correction. The conventional communications receiver usually combines the single offset adjustment correction with the communications signal before a first amplifier from the series of amplifiers. In this situation, the single offset adjustment correction may provide a large amount of compensation. The large amount of compensation allows the single offset adjustment correction to compensate for larger offsets in the communications signal. However, the large amount of compensation does not allow the single offset adjustment correction to compensate for smaller offsets in the communications signal. Alternatively, the conventional communications receiver may combine the single offset adjustment correction with the communications signal after a last amplifier from the series of amplifiers. In this situation, the single offset adjustment correction may provide a small correction. The small correction allows the single offset adjustment correction to may compensate for smaller offsets in the communications signal. However, the small resolution does not allow the single offset adjustment correction to compensate for larger offsets in the communications signal.

Thus, what is needed is an apparatus and method compensate for one or more offsets in the presence of one or more asymmetries that overcomes the shortcomings described above.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention. Rather, the scope of the present invention is defined only in accordance with the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Figure 1:
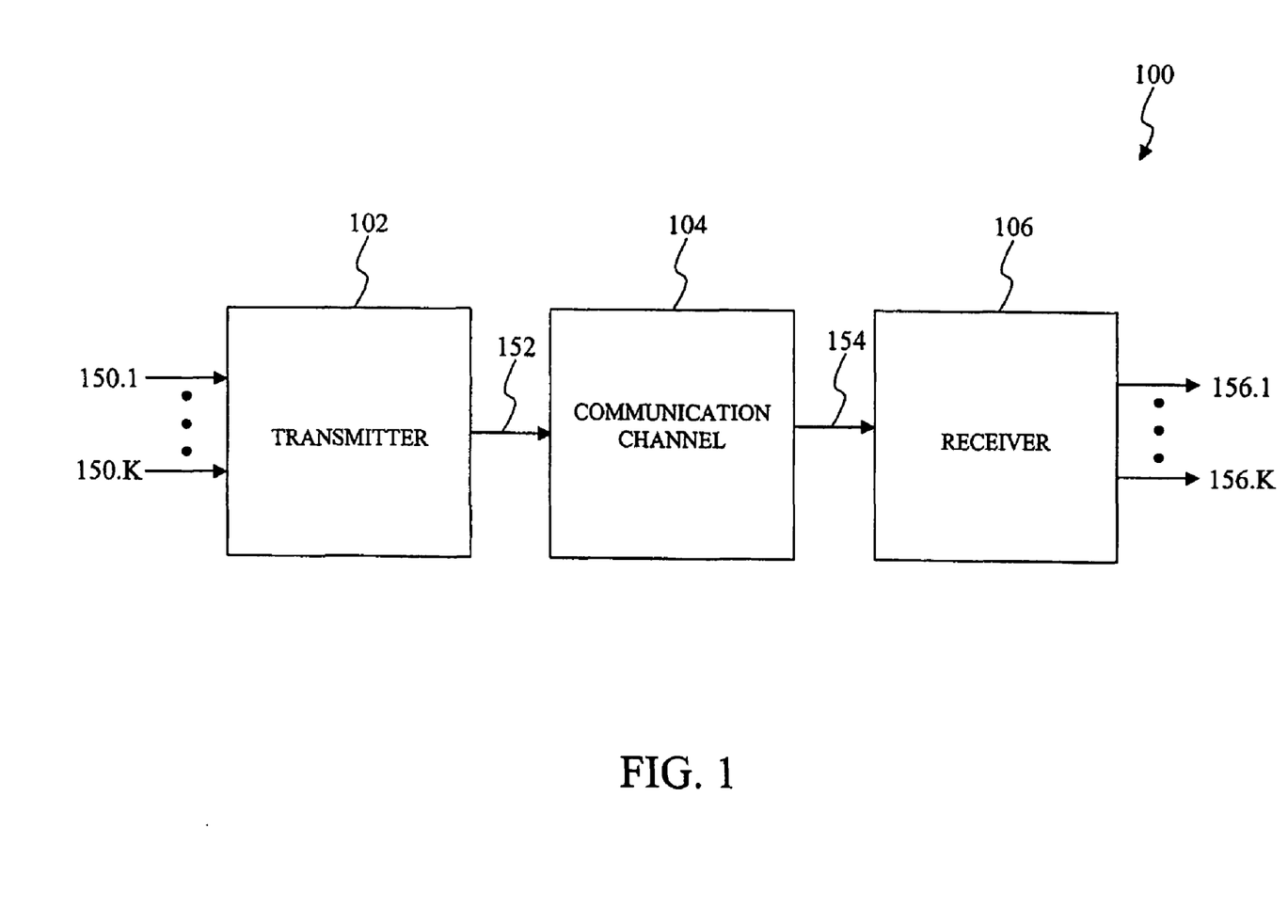
FIG. 1 illustrates a block diagram of a communications environment according to an exemplary embodiment of the present invention.

FIG. 1 illustrates a block diagram of a communications environment according to an exemplary embodiment of the present invention. The communications environment 100 includes a communications transmitter 102 to transmit one or more information signals, denoted as information signals 150.1 through 150.K, as received from one or more transmitter user devices to a communications receiver 106 via a communications channel 104. The one or more transmitter user devices may include, but are not limited to, personal computers, data terminal equipment, telephony devices, broadband media players, personal digital assistants, software applications, or any other device capable of transmitting or receiving data. The communications transmitter 102 provides a transmitted communications signal 152 based upon the information signals 150.1 through 150.K.

The transmitted communications signal 152 passes through the communications channel 104 to provide a received communications signal 154. The communications channel 104 may include, but is not limited to, a microwave radio link, a satellite channel, a fiber optic cable, a hybrid fiber optic cable system, or a copper cable to provide some examples. The communications channel 104 contains a propagation medium that the transmitted communications signal 152 passes through before reception by the communications receiver 106. The propagation medium of the communications channel 104 may introduce interference and/or distortion into the transmitted communications signal 152 causing the received communications signal 154 to differ from the transmitted communications signal 152. For example, the propagation medium of the communications channel 104 may cause one or more asymmetries in the transmitted communications signal 152. The one or more asymmetries may cause the received communications signal 154 to exhibit an asymmetric eye opening when compared to the transmitted communications signal 152.

The communications receiver 106 receives the received communications signal 154 as it passes through the communications channel 104 to provide one or more recovered information signals, denoted as recovered information signals 156.1 through 156.K, for one or more receiver user devices. The one or more receiver user devices may include, but are not limited to, personal computers, data terminal equipment, telephony devices, broadband media players, personal digital assistants, software applications, or any other device capable of transmitting or receiving data.

Figure 2A:
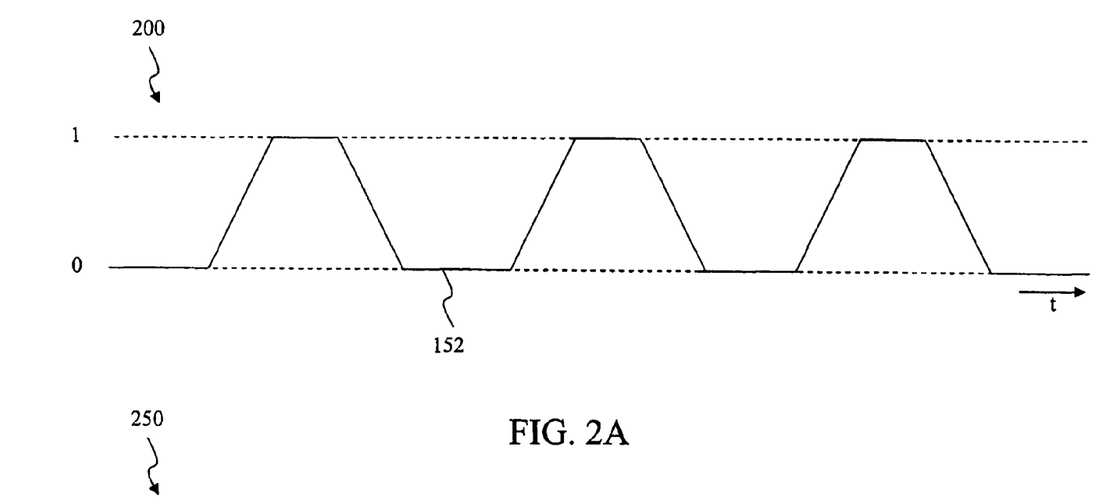
FIG. 2A illustrates a graphical representation of a transmitted communications signal used in the communications environment according to an exemplary embodiment of the present invention.

FIG. 2A illustrates a graphical representation of a transmitted communications signal used in the communications environment according to an exemplary embodiment of the present invention. However, this example is not limiting, the transmitted communications signal 152 as demonstrated in FIG. 2A is for illustrative purposes only. Those skilled in the relevant art(s) may implement the transmitted communications signal 152 differently without departing from the spirit and scope of the present invention.

The communications transmitter 102 may provide the transmitted communications signal 152 to the communications channel 104. As illustrated by a graphical representation 200, the transmitted communications signal 152 may be represented by a form of logic values based upon the binary number system, such as a binary zero and a binary one to provide some examples. For example, a symbol of the transmitted communications signal 152 may be encoded according to an on-off signaling scheme whereby a first transmitted amplitude corresponding to the binary one is represented by transmitting a symbol of constant amplitude for a duration of the symbol. In this example, a second transmitted amplitude corresponding to the binary zero is represented by not transmitting the symbol of constant amplitude for the duration of the symbol. However this example is not limiting, a symbol of the transmitted communications signal 152 may be encoded according to any multiple level signaling scheme that will be apparent to those skilled in the relevant art(s) without departing from the spirit and scope of the present invention.

Figure 2B:
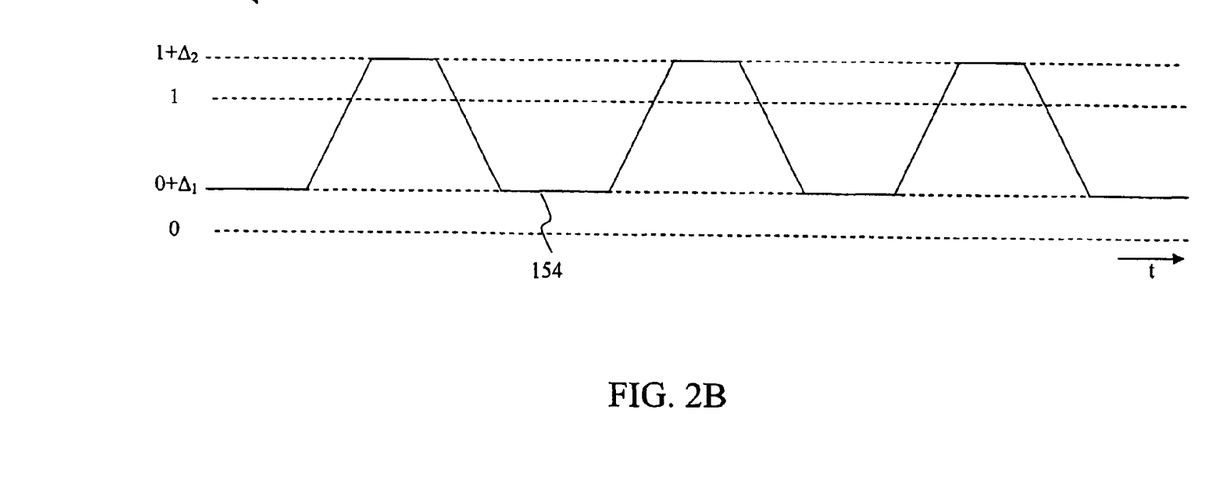
FIG. 2B illustrates a graphical representation of a received communications signal used in the communications environment according to an exemplary embodiment of the present invention.

FIG. 2B illustrates a graphical representation of a received communications signal used in the communications environment according to an exemplary embodiment of the present invention. However, this example is not limiting, the received communications signal 154 as demonstrated in FIG. 2B is for illustrative purposes only. Those skilled in the relevant art(s) may implement the received communications signal 154 differently without departing from the spirit and scope of the present invention.

The communications channel 104 may cause one or more asymmetries in the transmitted communications signal 152. The one or more asymmetries may cause the received communications signal 154 to differ from the transmitted communications signal 152. As illustrated by a graphical representation 250, the one or more asymmetries may cause the received communications signal 154 to differ from the transmitted communications signal 152. For example, the one or more asymmetries may offset the first transmitted amplitude by a binary one offset $\Delta_2$. Likewise, the one or more asymmetries may offset the second transmitted amplitude by a binary zero offset $\Delta_1$. The binary zero offset $\Delta_1$ and the binary one offset $\Delta_2$ may represent substantially equivalent offsets or substantially different offsets. The binary zero offset $\Delta_1$ and/or the binary one offset $\Delta_2$ may additionally represent one or more positive offsets, one or more negative offsets, and/or any combination thereof.

Figure 3:
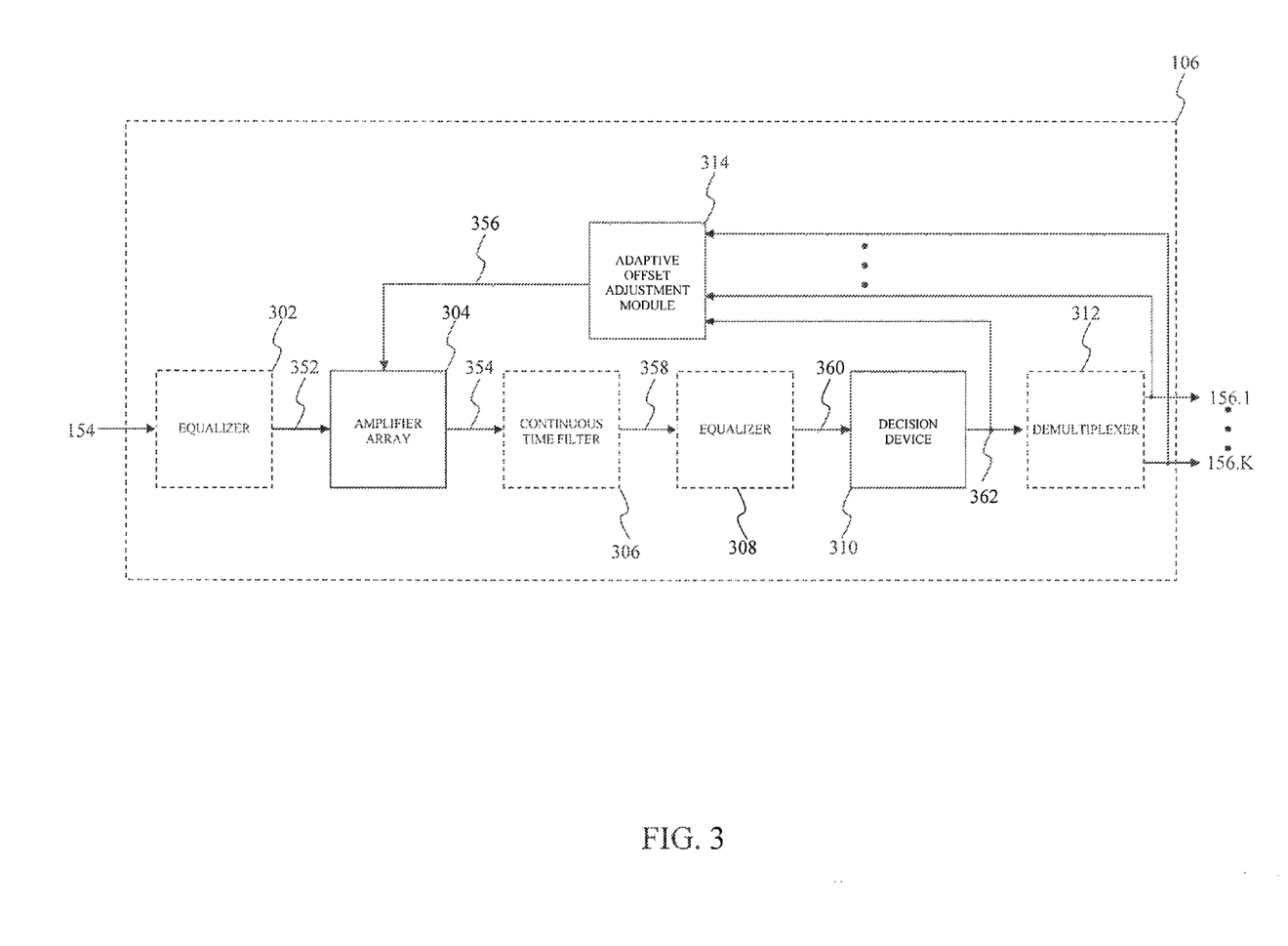
FIG. 3 illustrates a block diagram of a communications receiver used in the communications environment according to an exemplary embodiment of the present invention.

FIG. 3 illustrates a block diagram of a communications receiver used in the communications environment according to an exemplary embodiment of the present invention. The communications receiver 106 receives the received communications signal 154 from the communication channel 104. The communications channel 104 may cause one or more asymmetries in the transmitted communications signal 152. The one or more asymmetries may offset the received communications signal 154 by one or more offsets $\Delta$, such as the binary zero offset $\Delta_1$ and/or the binary one offset $\Delta_2$ to provide an example. The communications receiver 106 may compensate for the one or more offsets $\Delta$ in the presence of the one or more asymmetries to recover the recovered information signals 156.1 through 156.K.

The communications receiver 106 includes an equalizer 302, an amplifier array 304, a continuous time filter 306, an equalizer 308, a decision device 310, a demultiplexer 312, and an adaptive offset adjustment module 314. The equalizer 302 compensates for interference and/or distortion embedded in the received communications signal 154 by the communication channel 104 to provide an equalized communications signal 352. The equalizer 302 adaptively adjusts an impulse response according to equalization coefficients to compensate for interference and/or distortion embedded in the received communications signal 154. However, the equalizer 302 may not compensate for the one or more offsets Δ in the presence of the one or more asymmetries. The equalizer 302 may be implemented as, but is not limited to, a decision feedback equalizer (DFE), a feed forward equalizer (FFE), any suitable interference cancellation circuit, a concatenation of an interference cancellation circuit and/or adaptive equalizer, and/or any combination thereof. In an exemplary embodiment, the equalizer 302 is optional. In this exemplary embodiment, the amplifier array 304 may directly receive the received communications signal 154.

The amplifier array 304 provides an amplified communications signal 354 based upon the equalized communications signal 352. The amplifier array 304 may amplify the equalized communications signal 352 using one or more amplifiers. The amplifier array 304 may adjust the equalized communications signal 352 by one or more offset adjustment corrections 356 to compensate for the one or more offsets Δ.

The continuous time filter 306 filters the amplified communications signal 354 to provide a filtered communications signal 358. More specifically, the continuous time filter 306 filters out of band interference and/or distortion from the amplified communications signal 354. The out of band interference and/or distortion may result from, without limitation, interference and/or distortion resulting from the communications transmitter 102, the communication channel 104, and/or the communications receiver 106 to provide some examples. In an exemplary embodiment, the continuous time filter 306 is optional. In this exemplary embodiment, the equalizer 308 may directly receive the amplified communications signal 354.

The equalizer 308 compensates for interference and/or distortion embedded in the filtered communications signal 358 to provide an equalized communications signal 360. The equalizer 308 may be implemented as, but is not limited to, a decision feedback equalizer (DFE), a feed forward equalizer (FFE), any suitable interference cancellation circuit, a concatenation of an interference cancellation circuit and/or adaptive equalizer, and/or any combination thereof. The equalizer 308 operates in a substantially similar manner as the equalizer 302 and will not be described in further detail. In an exemplary embodiment, the equalizer 308 is optional. In this exemplary embodiment, the decision device 310 may directly receive the filtered communications signal 358.

The decision device 310 provides a recovered communications signal 362 based upon the equalized communications signal 360. The recovered communications signal 362 may include one or more decisions such as one or more hard decisions, one or more soft decisions, and/or any combination thereof. Mores specifically, the decision device 310 compares the equalized communications signal 360 to a threshold and assigns a digital value to the recovered communications signal 362 based upon the comparison to provide the hard decision. The threshold value may be adjusted according to the encoding of the received communication signal 154. For example, if the received communication signal 154 is encoded according to the on-off signaling scheme, the threshold value of the decision device 310 may be assigned to the statistical mean of the constant amplitudes representing the binary one and the binary zero. The symbols of the equalized communications signal 360 that are greater than the threshold value of the decision device 310 may be assigned to the binary one, while the symbols of the equalized communications signal 360 that are less than the threshold value of the decision device 310 may be assigned to the binary zero. Alternatively, the decision device 310 may incorporate soft decision information, such as a slicer error, a bit error ratio (BER), a symbol error ratio (SER), a signal to noise ratio (SNR), and/or any other suitable signal parameter into the hard decision to provide the soft decision.

The demultiplexer 312 provides the recovered information signals 156.1 through 156.K based upon the recovered communications signal 362. More specifically, the demultiplexer 312 may separate the recovered communications signal 362 into the recovered information signals 156.1 through 156.K. In an exemplary embodiment, the demultiplexer 312 is optional. In this exemplary embodiment, the recovered communications signal 362 represents the recovered information signals 156.1 through 156.K.

The adaptive offset adjustment module 314 provides the one or more offset adjustment corrections 356 based upon the recovered communications signal 362. The adaptive offset adjustment module 314 processes the recovered communications signal 362 serially to provide the one or more offset adjustment corrections 356. Alternatively, the adaptive offset adjustment module 314 provides the one or more offset adjustment corrections 356 based upon the recovered information signals 156.1 through 156.K. The adaptive offset adjustment module 314 processes the recovered information signals 156.1 through 156.K in parallel to provide the one or more offset adjustment corrections 356 allowing the adaptive offset adjustment module 314 to be operated at a slower speed when compared to the serial processing of the recovered communications signal 362. As will be understood by persons skilled in the relevant art(s) from the teachings provided herein, the adaptive offset adjustment module 314 may be readily implemented in hardware, software, or a combination of hardware and software. For example, based upon the teachings provided herein, those skilled in the relevant art(s) may implement the adaptive offset adjustment module 314 via a combination of one or more application specific integrated circuits and/or a processor core for implementing firmware and/or software commands stored in one or more memories.

The one or more offset adjustment corrections 356 may be used to compensate for the one or more offsets Δ. Each one of the one or more offset adjustment corrections 356 may include a plurality of possible offset corrections from a maximum offset correction to a minimum offset correction. The maximum offset correction represents a maximum possible correction that may be provided by a corresponding one of the one or more offset adjustment corrections 356. Likewise the minimum offset correction represents a minimum possible correction that may be provided by the corresponding one of the one or more offset adjustment corrections 356. The minimum possible correction and/or the maximum possible correction may represent a positive or a negative offset adjustment value that may be used to compensate for the one or more offsets Δ. A midpoint correction value represents a difference between the minimum offset correction and the maximum offset correction. For example, the plurality of possible offset corrections may include fifteen possible offset corrections with a first possible offset correction corresponding to the minimum offset correction through a fifteenth possible offset correction corresponding to the maximum offset correction. In this example, the midpoint correction value represents a seventh possible offset correction corresponding to difference between the first possible offset correction and the fifteenth possible offset correction. Each one of the one or more offset adjustment corrections 356 may provide a similar and/or a dissimilar offset adjustment to the amplifier array 304.

Figure 4:
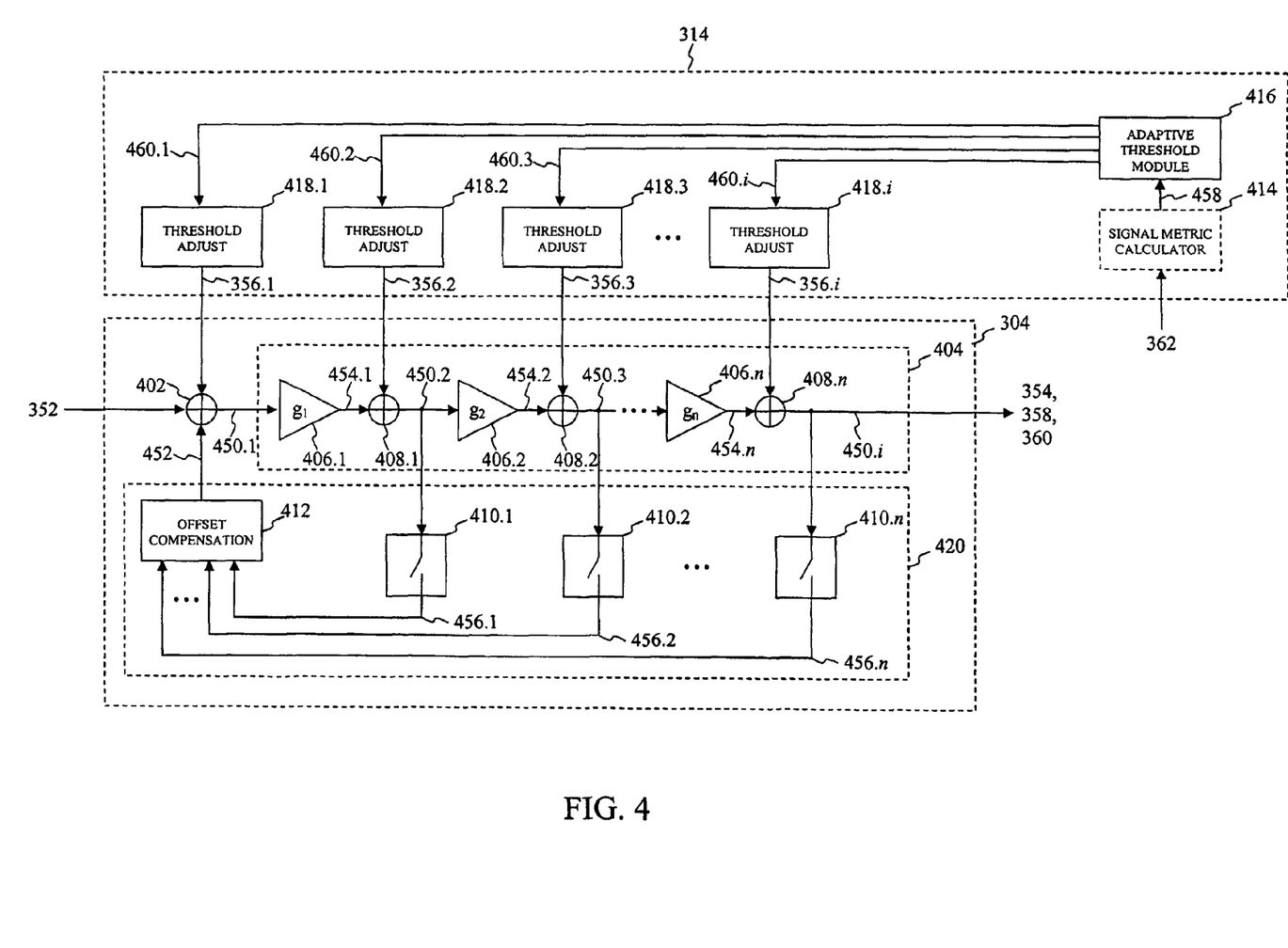
FIG. 4 illustrates a block diagram of an adaptive offset adjustment module used in the communications receiver according to an exemplary embodiment of the present invention

FIG. 4 illustrates a block diagram of an adaptive offset adjustment module used in the communications receiver according to an exemplary embodiment of the present invention. The adaptive offset adjustment module 314 carries out the adaptive offset algorithm to provide the amplifier array 304 with the offset adjustment corrections 356.1 through 356.*i*. The amplifier array 304 may compensate for the one or more offsets Δ based upon the offset adjustment corrections 356.1 through 356.*i*.

The amplifier array 304 includes a summation network 402, an amplifier array module 404, and a gain offset correction module 420. The summation network 402 combines the equalized communications signal 352 with the offset adjustment correction 356.1 to provide an offset adjusted communications signal 450.1. Alternatively, the summation network 402 may combine the equalized communications signal 352, the offset adjustment correction 356.1, and a gain stage offset correction 452 to provide the offset adjusted communications signal 450.1.

The amplifier array module 404 includes gain stages 406.1 through 406.*n* and summation networks 408.1 through 408.*n*. The gain stages 406.1 through 406.*n* amplify the offset adjusted communications signals 450.1 through 450.*n* by gains $g_1$ through $g_n$ to provide the amplified offset adjusted communications signals 454.1 through 454.*n*. For example, the gain stage 406.1 amplifies the offset adjusted communications signal 450.1 by the gain $g_1$ to provide the amplified offset adjusted communications signal 454.1. Likewise, the gain stage 406.2 amplifies the offset adjusted communications signal 450.2 by the gain $g_2$ to provide the amplified offset adjusted communications signal 454.2. Similarly, the gain stage 406.*n* amplifies the offset adjusted communications signal 450.*n* by the gain $g_n$ to provide the amplified offset adjusted communications signal 454.*n*.

The summation networks 408.1 through 408.*n* combine the amplified offset adjusted communications signals 454.1 through 454.*n* and the offset adjustment corrections 356.2 through 356.*i* to provide offset adjusted communications signals 450.2 through 450.*i*, respectively. For example, the summation network 408.1 combines the amplified offset adjusted communications signal 454.1 and the offset adjustment correction 356.2 to provide the offset adjusted communications signal 450.2. In this example, the summation network 408.1 adjusts the one or more offsets Δ by the offset adjustment correction 356.2. Likewise, the summation network 408.2 combines the amplified offset adjusted communications signal 454.2 and the offset adjustment correction 356.3 to provide the offset adjusted communications signal 450.3. In this example, the summation network 408.2 adjusts the one or more offsets Δ by the offset adjustment correction 356.3. Similarly, the summation network 408.*n* combines the amplified offset adjusted communications signal 454.*n* and the offset adjustment correction 356.*i* to provide the offset adjusted communications signal 450.*i*. In this example, the summation network 408.*n* adjusts the one or more offsets Δ by the offset adjustment correction 356.*i*. The offset adjusted communications signal 450.*i* may represent an exemplary embodiment of the amplified communications signal 354, the filtered communications signal 358, and/or the equalized communications signal 360 as discussed in FIG. 3.

The gain offset correction module 420 provides the gain stage offset correction 452 based upon the offset adjusted communications signals 450.2 through 450.*i*. The gain offset correction module 420 compensates for unwanted offsets of the gain stages 406.1 through 406.*n*. For example, device mismatches of the gain stages 406.1 through 406.*n* may cause the unwanted offsets in the offset adjusted communications signals 450.2 through 450.*i*. The gain offset correction module 420 includes switching modules 410.1 through 410.*n* and a gain offset compensation module 412. The switching modules 410.1 through 410.*n* provide one or more of the offset adjusted communications signals 450.2 through 450.*i* via selected offset adjusted communications signals 456.1 through 456.*n* to the gain offset compensation module 412. For example, the switching module 410.1 provides the offset adjusted communications signal 450.2 via the selected offset adjusted communications signal 456.1 to the gain offset compensation module 412.

The gain offset compensation module 412 compensates for the unwanted offsets of the gain stages 406.1 through 406.*n*. More specifically, the gain offset compensation module 412 may determine the gain stage offset correction 452 based upon the selected offset adjusted communications signals 456.1 through 456.*n*. The gain stage offset correction 452 when combined with equalized communications signal 352 substantially reduces the unwanted offsets of the gain stages 406.1 through 406.*n*. Alternatively, the gain offset compensation module 412 may provide the gain stage offset correction 452 having a predetermined offset correction value that when combined with the equalized communications signal 352 substantially reduces the unwanted offsets of the gain stages 406.1 through 406.*n*.

The adaptive offset adjustment module 314 provides the offset adjustment corrections 356.1 through 356.*i* based upon the recovered communications signal 362 to compensate for the one or more offsets Δ. In an exemplary embodiment, the offset adjustment corrections 356.1 through 356.*i* include at least two offset adjustment corrections 356.1 through 356.2. Each one of the offset adjustment corrections 356.1 through 356.*i* includes a plurality of possible offset corrections from a maximum offset correction to a minimum offset correction. The maximum offset correction represents a maximum possible correction that may be provided by the each one of the offset adjustment corrections 356.1 through 356.*i*. Likewise the minimum offset correction represents a minimum possible correction that may be provided by each one of the offset adjustment corrections 356.1 through 356.*i*. The minimum possible correction and/or the maximum possible correction may represent a positive or a negative offset adjustment value that may be used to compensate for the one or more offsets Δ. Each one of the offset adjustment corrections 356.1 through 356.*i* may provide a similar and/or a dissimilar offset adjustment to the amplifier array 304.

The offset adjustment corrections 356.1 through 356.*i* optimize the compensation for the one or more offsets Δ. A more significant one of the one or more offset adjustment corrections, such as the offset adjustment correction 356.1 to provide an example, may provide a greater amount of compensation when compared to a less significant one of the one or more offset adjustment corrections, such as the offset adjustment correction 356.2 to provide an example. For example, the offset adjustment correction 356.1 is amplified by the gain stages 406.1 through 406.*n* to provide the greater amount of compensation when compared to the offset adjustment correction 356.*i* having no amplification by the gain stages 406.1 through 406.*n*. However, the less significant one of the one or more offset adjustment corrections may provide a finer resolution of compensation when compared to the more significant one of the one or more offset adjustment corrections. For example, adjustments in the less significant one of the one or more offset adjustment corrections provide a lesser adjustment in compensation when compared to the more significant one of the one or more offset adjustment corrections.

The adaptive offset adjustment module 314 includes a signal metric calculator 414, an adaptive offset algorithm module 416, and offset adjust modules 418.1 through 418.i. The signal metric calculator 414 may calculate one or more signal metrics 458, such as but not limited to, slicer error, a bit error ratio (BER), a symbol error ratio (SER), a signal to noise ratio (SNR), and/or any other suitable signal parameter of the recovered communications signal 362. In an exemplary embodiment, the signal metric calculator 414 is optional. In this exemplary embodiment, the adaptive offset adjustment module 314 may directly receive the recovered communications signal 362. For example, the adaptive offset adjustment module 314 may directly use the soft decision information embedded into the recovered communications signal 362 by the decision device 310.

The adaptive offset processing module 416 carries out an adaptive offset algorithm, to be discussed in further detail below, to provide the offset adjustment control signals 460.1 through 460.i to the offset adjust modules 418.1 through 418.i. The offset adjust modules 418.1 through 418.i provide the offset adjustment corrections 356.1 through 356.i based upon the offset adjustment control signals 460.1 through 460.i. For example, the offset adjust module 418.1 provides the offset adjustment correction 356.1 based upon the adjustment control signal 460.1. More specifically, the offset adjust modules 418.1 through 418.i convert the offset adjustment control signals 460.1 through 460.i to the offset adjustment corrections 356.1 through 356.i. In an exemplary embodiment, the offset adjustment corrections 356.1 through 356.i represent one or more DC currents. In this exemplary embodiment, the offset adjust modules 418.1 through 418.i may convert the offset adjustment control signals 460.1 through 460.i to the offset adjustment corrections 356.1 through 356.i. For example, the offset adjust module 418.1 may convert the adjustment control signal 460.1 to a first current corresponding to the offset adjustment correction 356.1. In another exemplary embodiment, the offset adjust modules 418.1 through 418.i convert the offset adjustment control signals 460.1 through 460.i to the offset adjustment corrections 356.1 through 356.i using one or more digital to analog converters (DACs).

Figure 5:
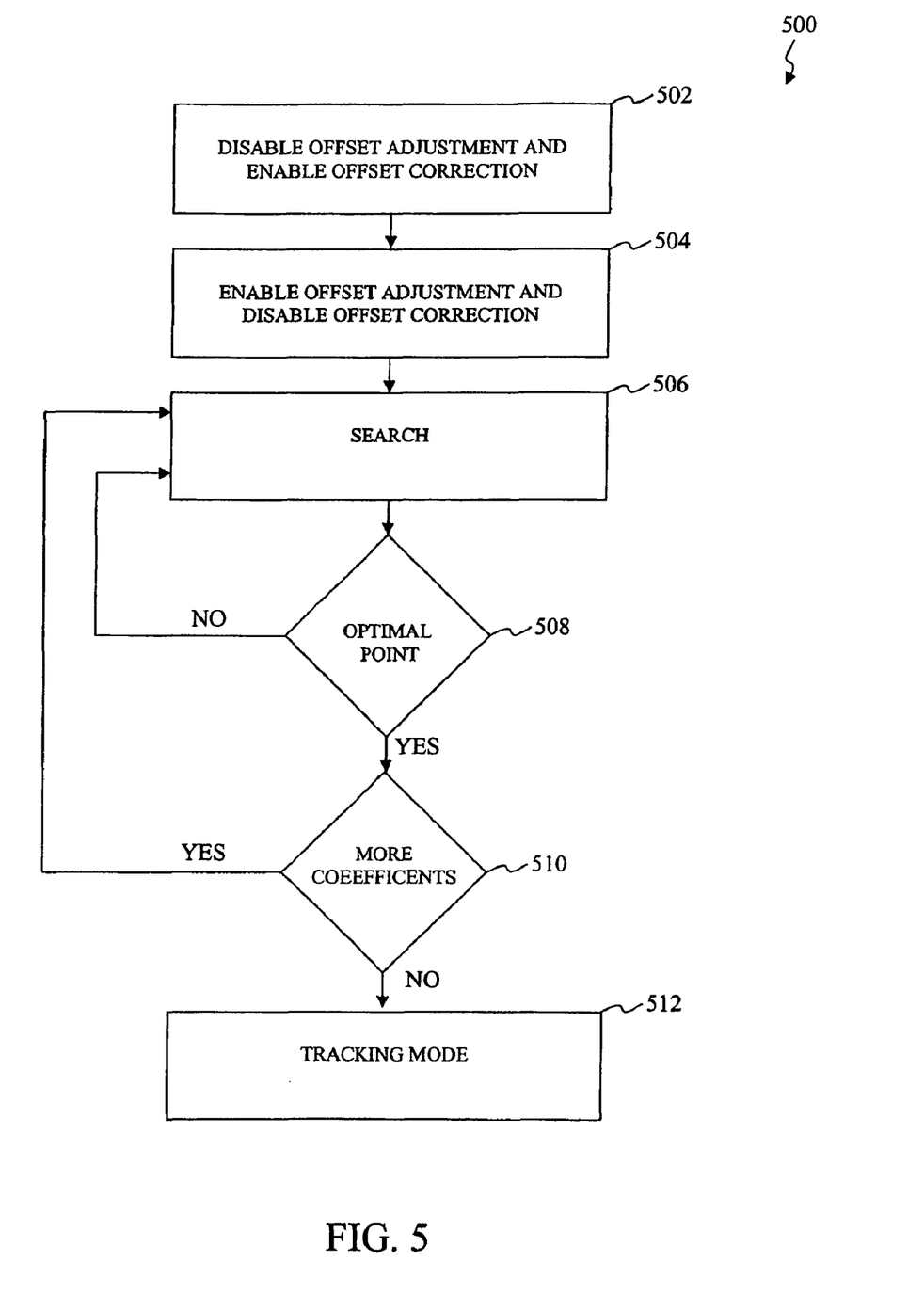
FIG. 5 is a flowchart of exemplary operational steps of an adaptive offset algorithm used in the adaptive offset adjustment module according to an aspect of the present invention.

FIG. 5 is a flowchart 500 of exemplary operational steps of an adaptive offset algorithm used in the adaptive offset adjustment module according to an aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 5.

At step 502, the adaptive offset algorithm disables an offset adjustment module, such as the offset adjustment module 314 to provide an example, and/or enables an offset correction module, such as the gain offset correction module 420 to provide an example. The offset correction module may compensate for unwanted offsets, such as device mismatches of one or more amplifiers, such as the gain stages 406.1 through 406.n to provide an example.

At step 504, the adaptive offset algorithm enables the offset adjustment module to provide an amplifier array, such as the amplifier array 304 to provide an example, with one or more offset adjustment corrections, such as the one or more offset adjustment corrections 356 to provide an example, and/or the adaptive offset algorithm disables the offset correction module from step 502.

At step 506, the adaptive offset algorithm carries out an initial search procedure for a selected offset adjustment correction from the one or more offset adjustment corrections from step 504. In an exemplary embodiment, the adaptive offset algorithm selects a second most significant one of the one or more offset adjustment corrections, such as the offset adjustment correction 356.2 to provide an example, in step 506 to represent the selected offset adjustment correction. As to be discussed in FIG. 6 and FIG. 7, the initial search procedure provides a signal metric map including a signal metric for each of a plurality of possible offset corrections of the selected offset adjustment correction. The initial search procedure is further described in FIG. 6 and FIG. 7.

At step 508, the adaptive offset algorithm determines an optimal point for the selected offset adjustment correction. More specifically, the adaptive offset algorithm compares the signal metric map for the selected offset adjustment correction with a signal metric threshold to determine the optimal point. The adaptive offset algorithm reverts back to step 506 when none of the signal metrics for selected offset adjustment correction are greater than or equal to the signal metric threshold. In this situation, the adaptive offset algorithm may select one of the one or more non-selected offset adjustment corrections from step 504 to represent the selected offset adjustment correction. In an exemplary embodiment, the adaptive offset algorithm selects a second most significant one of the one or more offset adjustment corrections, such as the offset adjustment correction 356.2 to provide an example, in step 506 to represent the selected offset adjustment correction. In this exemplary embodiment, when none of the signal metrics for the second most significant one of the one or more offset adjustment corrections are greater than or equal to the signal metric threshold in step 508, the adaptive offset algorithm may select a first most significant one of the one or more offset adjustment corrections, such as the offset adjustment correction 356.1 to provide an example, as the selected offset adjustment correction when the adaptive offset algorithm reverts back to step 506.

Figure 7:
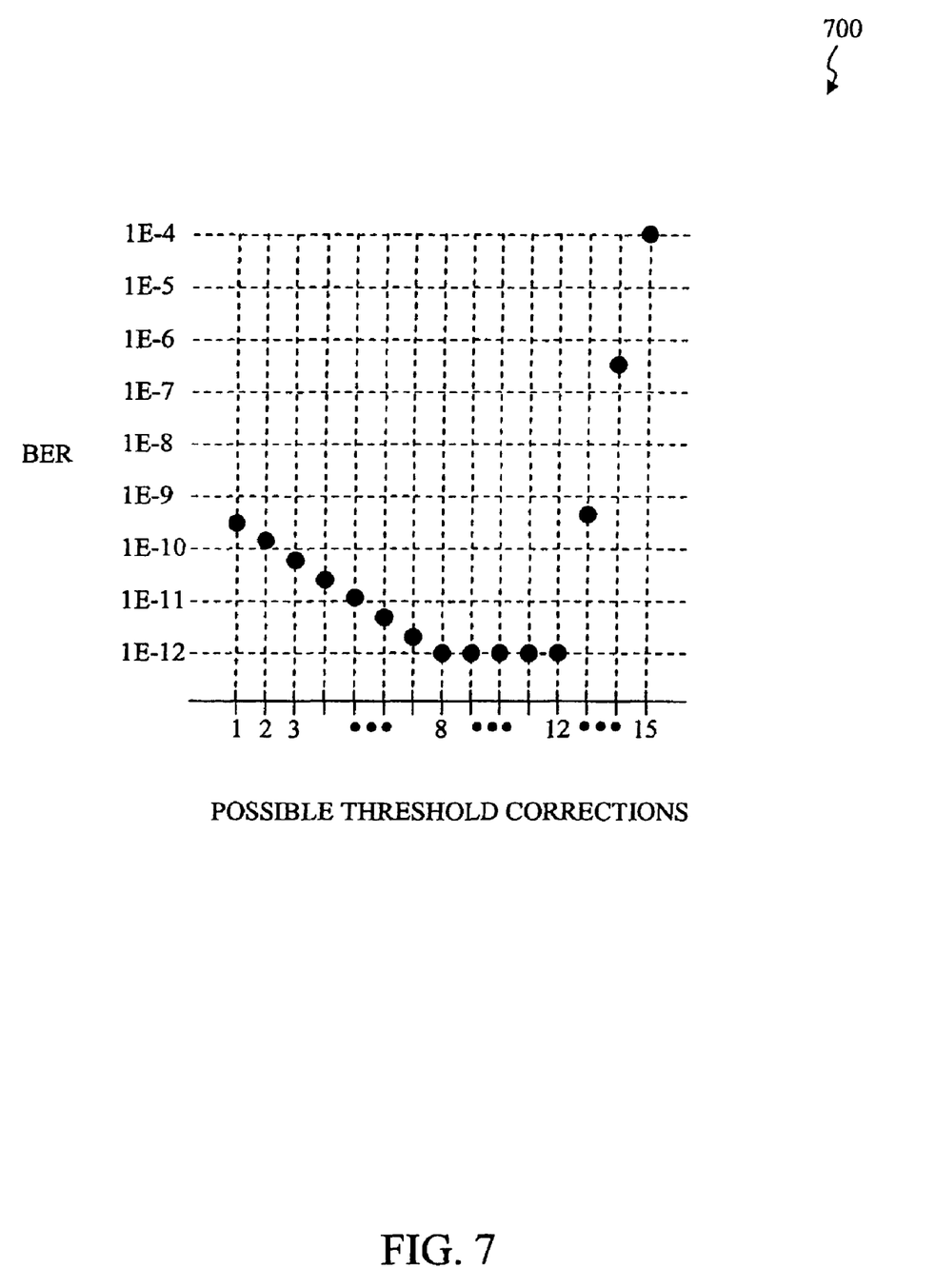
FIG. 7 illustrates a signal metric map provided by the initial search procedure according to an exemplary embodiment of the present invention.

Alternatively, when one or more of the signal metrics for the selected offset adjustment correction are greater than or equal to the signal metric threshold, the adaptive offset algorithm proceeds to step 510. If one signal metric is greater than or equal to the signal metric threshold, the adaptive offset algorithm assigns the possible offset correction value corresponding to the one signal metric as the optimal point. If more than one signal metric is greater than or equal to the signal metric threshold, the adaptive offset algorithm assigns a midpoint of the possible offset correction values corresponding to the more than one signal metric as the optimal point. For example, if the eighth possible offset correction through the twelfth possible offset correction, as shown in FIG. 7 to be discussed below, are greater than or equal to the signal metric threshold, the adaptive offset algorithm assigns the tenth possible offset correction as the optimal point.

At step 510, the adaptive offset algorithm may revert back to step 506 to determine the optimal point for another one of the one or more non-selected offset adjustment corrections from step 506 while applying the optimal point from step 508 to the selected offset adjustment correction in step 506. For example, the adaptive offset algorithm may select the second most significant one of the one or more offset adjustment corrections, in step 506 to represent the selected offset adjustment correction. In this example, the adaptive offset algorithm may determine the optimal point for the second most significant one of the one or more offset adjustment corrections in step 508. At step 510, the adaptive offset algorithm may revert back to step 506 to determine the optimal point for a third most significant one of the one or more offset adjustment corrections, such as the offset adjustment correction 356.3 to provide an example while applying the optimal point from step 508 to the second most significant one of the one or more offset adjustment corrections. The adaptive offset algorithm may revert back to step 506 to determine the optimal point of any number of the offset adjustment corrections in a similar manner. After determining a suitable number of optimal points of the one or more offset adjustment corrections, the adaptive offset algorithm proceeds to step 512.

At step 512, the adaptive offset algorithm compensates for the one or more offsets Δ by adjusting each of the one or more selected offset adjustment corrections to their respective optimal points and/or each of the one or more non-selected offset adjustment corrections to a respective non-optimal point to provide one or more adjusted offset adjustment corrections. The non-optimal point may represent one of the possible offset corrections, such as the midpoint correction value to provide an example, from the plurality of possible offset corrections. The adaptive offset algorithm carries out a tracking mode procedure to optimize the one or more adjusted offset adjustment corrections. The tracking mode procedure is further described in FIG. 8.

Figure 6:
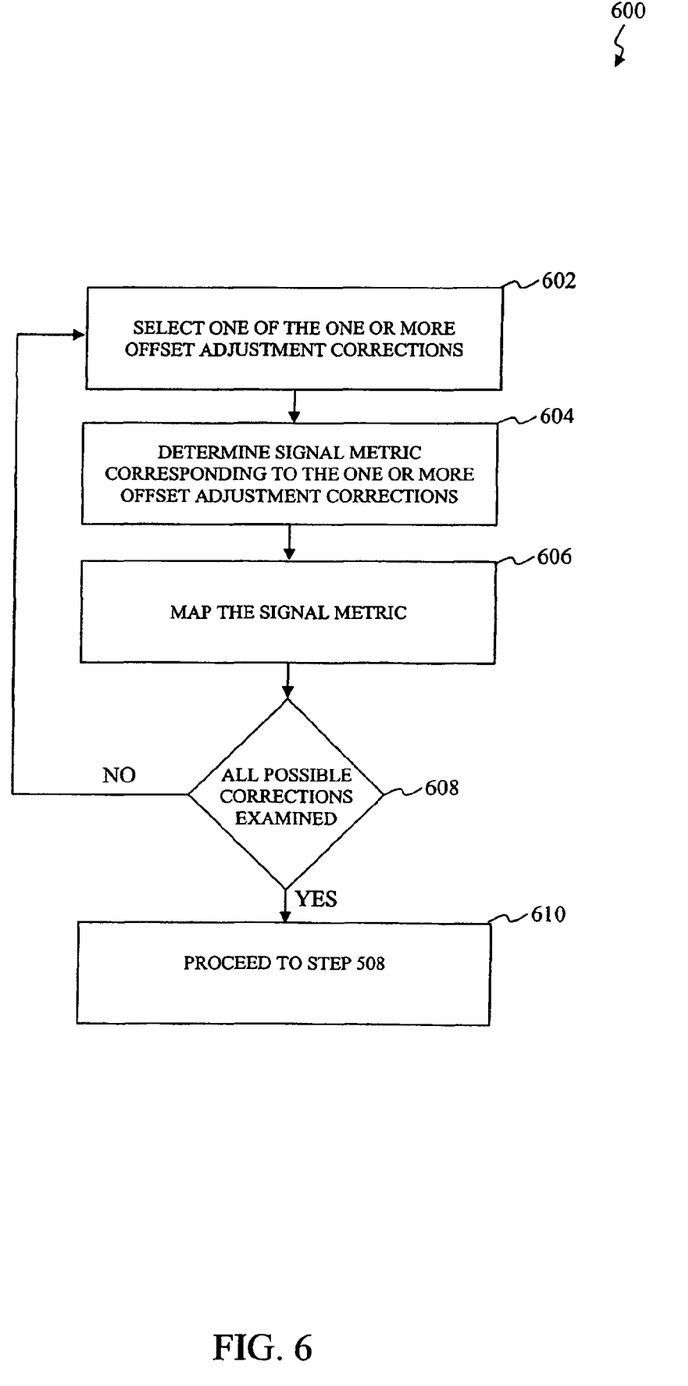
FIG. 6 is a flowchart of exemplary operational steps of an initial search procedure used in the adaptive offset algorithm according to an aspect of the present invention.

FIG. 6 is a flowchart 600 of exemplary operational steps of an initial search procedure used in the adaptive offset algorithm according to an aspect of the present invention. More specifically, FIG. 6 further describes step 506 as described in FIG. 5. The invention is not limited to this operational description. Rather, it will be apparent to persons skilled in the relevant art(s) from the teachings herein that other operational control flows are within the scope and spirit of the present invention. The following discussion describes the steps in FIG. 6.

At step 602, the initial search procedure selects one of the one or more offset adjustment corrections from step 504, such as the offset adjustment correction 356.1 to provide an example, to provide the selected offset adjustment correction. A remaining one or more of the one or more offset adjustment corrections from step 504, such as the offset adjustment corrections 356.2 through 356.i to provide an example, represent one or more non-selected offset adjustment corrections. In an exemplary embodiment, the initial search procedure selects a second most significant one of the one or more offset adjustment corrections, such as the offset adjustment correction 356.2 to provide an example. In this exemplary embodiment, the adaptive offset algorithm may select the remaining one or more of the one or more offset adjustment corrections, such as the offset adjustment correction 356.1 and one or more offset adjustment corrections 356.3 to 356.i provide an example, to represent the non-selected offset adjustment corrections. However, this example is not limiting, those skilled in the relevant art(s) will recognize that the initial search procedure may select any one of the one or more offset adjustment corrections without departing from the spirit and scope of the present invention. The initial search procedure selects a possible offset correction from the plurality of possible offset corrections for the selected offset adjustment correction. The adaptive offset algorithm may select respective midpoint correction values from the plurality of possible offset corrections for the non-selected offset adjustment corrections.

At step 604, the initial search procedure determines a signal metric of a communications receiver, such as the communications receiver 106 to provide an example, using the possible offset correction from step 602. More specifically, the initial search procedure may determine a slicer error, a bit error ratio (BER), a symbol error ratio (SER), a signal to noise ratio (SNR), and/or any other suitable signal parameter of the communications receiver using the selected offset adjustment correction from step 602.

In an exemplary embodiment, the initial search procedure determines a BER of the communication receiver. In this exemplary embodiment, the initial search procedure accumulates a number of binary zeros and binary ones in a recovered communications signal, such as the recovered communications signal 362 to provide an example, for a duration of a timing window. The initial search procedure compares the number of binary zeros and binary ones for the duration of the timing window with an expected number of binary zeros and binary ones. For example, the expected number of binary zeros and binary ones for a random communications signal may exhibit an equal number of binary zeros and binary ones for the duration of the timing window. However, this example is not limiting, those skilled in the relevant art(s) will recognize that the random communications signal may exhibit an expected bias towards either binary zero or binary one without departing from the spirit and scope of the present invention. In this situation, the expected number of binary zeros and binary ones will accurately reflect the expected bias. Any deviation between the expected number of binary zeros and binary ones and the number of binary zeros and binary ones accumulated represents bit errors. For example, a BER of $1\times10^{-4}$ corresponds to one error out of 10,000 representing 4,999 binary zeros/binary ones and 5,001 binary ones/binary zeros.

At step 606, the initial search procedure maps the signal metric from step 604 for the possible offset correction from step 602 on the signal metric map.

At step 608, the initial search procedure determines whether the signal metric has been determined in step 604 and mapped in step 606 for each possible offset correction in the plurality of possible offset corrections. If the signal metric has not been determined in step 604 and mapped in step 606 for each possible offset correction in the plurality of possible offset corrections, the initial search procedure reverts to step 602 to select another possible offset correction from the plurality of possible offset corrections. Else, the signal metric has been determined in step 604 and mapped in step 606 for the plurality of possible offset corrections, and the initial search procedure proceeds to step 508.

FIG. 7 illustrates a signal metric map provided by the initial search procedure according to an exemplary embodiment of the present invention. More specifically, FIG. 7 illustrates map 700 of the BER of the communications receiver using the selected offset adjustment correction from step 602 having a plurality of fifteen possible offset corrections. However, this example is not limiting, those skilled in the relevant art(s) will recognize that that the signal metric map may illustrate any signal metric having k possible offset corrections without departing from the spirit and scope of the present invention.

As shown in FIG. 7, the initial search procedure maps the BER of the communications receiver using the selected offset adjustment correction from step 602 having a plurality of fifteen possible offset corrections. The BER of the communications receiver using a first possible correction, denoted by 1, corresponds to a BER between $1\times10^{-9}$ and $1\times10^{-10}$. Similarly, the BER of the communications receiver using an eighth possible threshold value, denoted as 8, through an twelfth possible threshold value, denoted as 12, corresponds to a BER of $1\times10^{-12}$. Likewise, BER of the communications receiver using a fifteen possible correction, denoted by 15, corresponds to a BER of $1\times10^{-4}$. It should be noted that in this exemplary embodiment, the BER of $1\times10^{-12}$ represents a minimum BER that the initial search procedure determines.

In other words, the eighth possible threshold value through the twelfth possible threshold value may actually correspond to a lesser or smaller BER. A larger or smaller minimum BER may be determined by varying the duration of the timing window in step 606.

Figure 8:
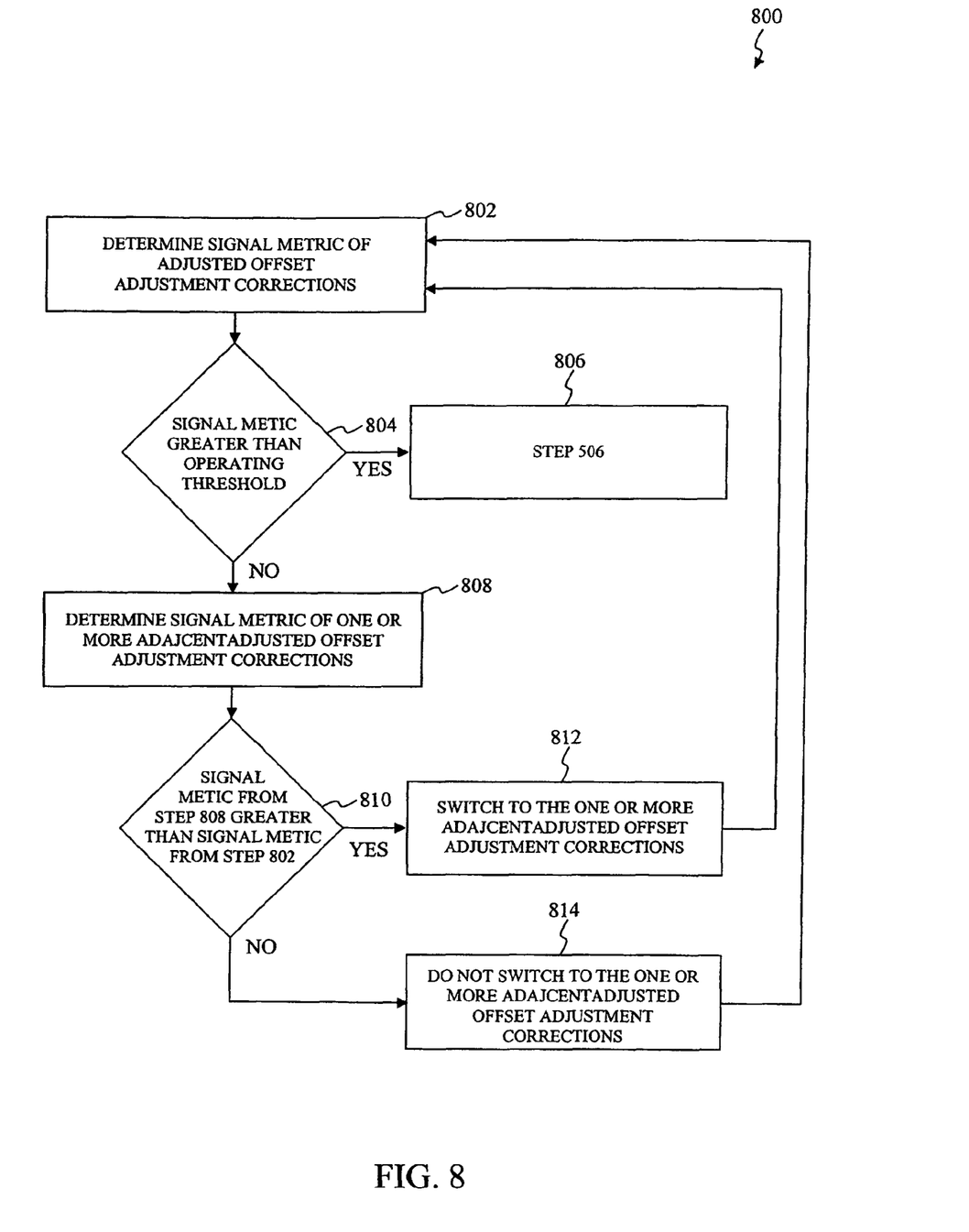
FIG. 8 is a flowchart of exemplary operational steps of a tracking mode procedure used in the adaptive offset algorithm according to an aspect of the present invention.

FIG. 8 is a flowchart 800 of exemplary operational steps of a tracking mode procedure used in the adaptive offset algorithm according to an aspect of the present invention. More specifically, FIG. 8 further describes step 512 as described in FIG. 5. The invention is not limited to this operational description. Rather, it will be apparent to persons skilled in the relevant art(s) from the teachings herein that other operational control flows are within the scope and spirit of the present invention. The following discussion describes the steps in FIG. 8.

At step 802, the tracking mode procedure determines a signal metric of a communications receiver, such as the communications receiver 106 to provide an example, based upon the one or more adjusted offset adjustment corrections. The tracking mode procedure may determine a slicer error, a bit error ratio (BER), a symbol error ratio (SER), a signal to noise ratio (SNR), and/or any other suitable signal parameter of the communications receiver.

At step 804, the tracking mode procedure compares the signal metric from step 802 with an operating threshold. The operating threshold corresponds to a minimum performance expectation of the communications receiver. When the signal metric is greater than the operating threshold, the tracking mode procedure proceeds to step 806. Alternatively, the signal metric is less than or equal to the operating threshold, the tracking mode procedure proceeds to step 808. For example, the tracking mode procedure may compute the BER of the communications receiver in step 802. In this example, the tracking mode proceeds to step 806 when the BER is greater than a minimum BER or to step 808 when the BER is less than or equal to a minimum BER.

At step 806, the signal metric of the communications receiver is greater than the operating threshold. The tracking mode procedure reverts back to step 506 to determine another optimal point.

At step 808, the signal metric of the communications receiver is less than or equal to the operating threshold. The tracking mode procedure determines a signal metric of the communications receiver based upon one or more adjacent adjusted offset adjustment corrections. More specifically, the tracking mode procedure may adjust one or more of the optimal points of the one or more selected offset adjustment corrections and/or one or more of the corresponding one of the possible offset corrections to the one or more non-selected offset adjustment corrections to an adjacent offset correction, such as a preceding offset correction and/or a subsequent offset correction to provide some examples, from the plurality of possible offset corrections to provide the one or more adjacent adjusted offset adjustment corrections. In an exemplary embodiment, the tracking mode procedure may adjust a first least significant one of the one or more offset adjustment corrections, such as the offset adjustment correction 356.*i* to provide an example. In this exemplary embodiment, the tracking mode procedure may adjust the first least significant one of the one or more offset adjustment corrections to the preceding offset correction and/or the subsequent offset correction from the plurality of possible offset corrections to provide the one or more adjacent adjusted offset adjustment corrections.

At step 810, the tracking mode procedure compares the signal metric from step 802 with the signal metric from step 808. When the signal metric from step 802 is greater than the signal metric from step 808, the tracking mode procedure proceeds to step 812. When the signal metric from step 802 is less than or equal to the signal metric from step 808, the tracking mode procedure proceeds to step 814.

At step 812, the signal metric from step 808 is greater than the signal metric from step 802. The tracking mode procedure selects the one or more adjacent adjusted offset adjustment corrections from step 808 to represent the selected offset adjustment correction from step 802. The tracking mode procedure reverts back to step 802 to determine the signal metric of the communications receiver based upon the one or more adjacent adjusted offset adjustment corrections from step 808.

At step 814, the signal metric from step 802 is less than or equal to the signal metric from step 808. The tracking mode does not select the one or more adjacent adjusted offset adjustment corrections from step 808 to represent the selected offset adjustment correction from step 802. The tracking mode procedure reverts back to step 802 to determine the signal metric of the communications receiver based upon the one or more offset adjustment corrections from step 802.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present invention. Thus, the present invention should not be limited by any of the above-described exemplary embodiments, but should be defined only in accordance with the following claims and their equivalents.

What is claimed is:

1. A method to optimize an offset adjustment correction from among a plurality of offset adjustment corrections used to compensate for an offset in a communication signal, comprising:

selecting a selected offset adjustment correction from among the plurality of offset adjustment corrections;

combining the communication signal and the selected offset adjustment correction to provide an offset adjusted communications signal;

determining a signal metric based upon the offset adjusted communications signal; and determining an optimal point of the selected offset adjustment correction based upon the signal metric.

2. The method of claim 1, wherein the step of selecting comprises:

selecting a second most significant offset adjustment correction from among the plurality of offset adjustment corrections.

3. The method of claim 1, wherein the step of combining comprises:

amplifying the communication signal to provide an amplified offset adjusted communications signal; and combining the amplified offset adjusted communications signal and the selected offset adjustment correction to provide the offset adjusted communications signal.

4. The method of claim 1, wherein the selected offset adjustment correction includes a plurality of offset corrections, and wherein the step of determining the signal metric comprises:

selecting an offset correction from among the plurality of offset corrections;

combining the communication signal and the offset correction to provide the offset adjusted communications signal;

assigning a digital value to the offset adjusted communications signal to provide a recovered communications signal;

determining a corresponding signal metric of the recovered communications signal; and repeating the steps of selecting the offset correction through determining the corresponding signal metric for the plurality of offset corrections to provide the signal metric.

5. The method of claim 4, wherein the step of determining the signal metric comprises:

determining a bit to error ratio (BER) of the recovered communications signal.

6. The method of claim 5, wherein the step of determining the BER comprises:

accumulating a number of binary zeros and binary ones of the recovered communications signal for a duration of a timing window;

comparing the number of binary zeros and binary ones for the duration of the timing window with an expected number of binary zeros and binary ones; and determining the BER based upon a deviation between the expected number of binary zeros and binary ones and the number of binary zeros and binary ones accumulated.

7. The method of claim 1, wherein the selected offset adjustment correction includes a plurality of offset corrections, and wherein the step of determining the signal metric comprises:

determining a corresponding signal metric of the recovered communications signal using each of the plurality of offset corrections to provide the signal metric.

8. The method of claim 7, wherein the step of determining the optimal point comprises:

comparing the signal metric with a signal metric threshold; and assigning the optimal point based upon the comparison.

9. The method of claim 8, wherein the step of assigning comprises:

assigning an offset correction from among the plurality of offset corrections whose signal metric is greater than or equal to the signal metric threshold as the optimal point.

10. The method of claim 1, further comprising:

adjusting the selected offset adjustment correction to the optimal point.

11. The method of claim 10, wherein the step of adjusting comprises:

adjusting a non-selected offset adjustment correction from among the plurality of offset adjustment corrections to a non-optimal point.

12. The method of claim 11, wherein the non-selected offset adjustment correction includes a plurality of offset corrections, and wherein the step of adjusting the non-selected offset adjustment correction comprises:

adjusting the non-selected offset adjustment correction to a midpoint correction value from among the plurality of offset corrections.

13. The method of claim 1, further comprising:

repeating the steps of selecting through determining the optimal point for another selected offset adjustment correction from among the plurality of offset adjustment corrections.

14. A method to optimize an offset adjustment correction from among a plurality of adjustment corrections used to compensate for an offset in a communication signal, comprising:

adjusting a selected offset adjustment correction from among the plurality of offset adjustment corrections to a first correction value;

combining the communication signal and the first correction value to provide a first offset adjusted communications signal;

determining a first signal metric based upon the first offset adjusted communications signal;

adjusting the selected offset adjustment correction to a second correction value;

combining the communication signal and the second correction value to provide a second offset adjusted communications signal;

determining a second signal metric based upon the second offset adjusted communications signal; and selecting as the optimal point the second correction value when the second signal metric is substantially greater than the first signal metric.

15. The method of claim 14, wherein the step of adjusting the selected offset adjustment correction to the first correction value further comprises:

adjusting a non-selected offset adjustment correction from among the plurality of offset adjustment corrections to a non-optimal point.

16. The method of claim 15, wherein the non-selected offset adjustment correction includes a plurality of offset corrections, and wherein the step of adjusting the-non-selected offset adjustment correction comprises:

adjusting the non-selected offset adjustment correction to a midpoint correction value.

17. The method of claim 14, wherein the step of determining the first signal metric comprises:

determining a bit to error ratio (BER) based upon the first offset adjusted communications signal.

18. The method of claim 17, wherein the step of determining the BER comprises:

accumulating a number of binary zeros and binary ones of the first offset adjusted communications signal for a duration of a timing window;

comparing the number of binary zeros and binary ones for the duration of the timing window with an expected number of binary zeros and binary ones; and determining the BER based upon a deviation between the expected number of binary zeros and binary ones and the number of binary zeros and binary ones accumulated.

19. The method of claim 14, wherein the step of adjusting the selected offset adjustment correction to the second correction value comprises:

adjusting the selected offset adjustment correction to an adjacent optimal point and a non-selected offset adjustment correction from among the plurality of offset adjustment corrections to an adjacent non-optimal point.

20. The method of claim 19, wherein the non-selected offset adjustment correction includes a plurality of offset corrections, and wherein the step of adjusting the selected offset adjustment correction to the adjacent optimal point comprises:

adjusting the non-selected offset adjustment correction to an adjacent midpoint correction value.

21. The method of claim 19, wherein the step of selecting as the optimal point comprises:

selecting as the optimal point the adjacent optimal point and the non-optimal point as the adjacent non-optimal point when the second signal metric is substantially greater than the first signal metric.

22. The method of claim 14, wherein the step of determining the second signal metric comprises:

determining a bit to error ratio (BER) based upon the second offset adjusted communications signal.

23. The method of claim 22, wherein the step of determining the BER comprises:

accumulating a number of binary zeros and binary ones of the second offset adjusted communications signal for a duration of a timing window;

comparing the number of binary zeros and binary ones for the duration of the timing window with an expected number of binary zeros and binary ones; and determining the BER based upon a deviation between the expected number of binary zeros and binary ones and the number of binary zeros and binary ones accumulated.

* * * * *

UNITED STATES PATENT AND TRADEMARK OFFICE
CERTIFICATE OF CORRECTION

| | |
|---|---|
| PATENT NO. | : 8,369,453 B2 |
| APPLICATION NO. | : 12/314051 |
| DATED | : February 5, 2013 |
| INVENTOR(S) | : Kocaman et al. |

It is certified that error appears in the above-identified patent and that said Letters Patent is hereby corrected as shown below:

In the Claims:

At column 16, line 40, please replace "the-non-selected" with --the non-selected--.

Signed and Sealed this
Seventh Day of May, 2013

Teresa Stanek Rea
*Acting Director of the United States Patent and Trademark Office*